United States Patent [19]

Konaka et al.

[11] Patent Number: 4,651,411

[45] Date of Patent: Mar. 24, 1987

[54] METHOD OF MANUFACTURING A MOS DEVICE WHEREIN AN INSULATING FILM IS DEPOSITED IN A FIELD REGION

[75] Inventors: Masami Konaka, Kawasaki; Naoyuki Shigyo; Ryo Dang, both of Yokohama, all of Japan

[73] Assignee: Tokyo Shibaura Denki Kabushiki Kaisha, Kawasaki, Japan

[21] Appl. No.: 744,899

[22] Filed: Jun. 17, 1985

Related U.S. Application Data

[63] Continuation of Ser. No. 435,663, Oct. 21, 1982.

[30] Foreign Application Priority Data

Oct. 27, 1981 [JP] Japan .................................. 56-171784

[51] Int. Cl.⁴ ........................ H01L 21/76; H01L 29/78
[52] U.S. Cl. ................................. 29/576 W; 29/571; 148/DIG. 50
[58] Field of Search ............... 29/571, 576 W; 357/49, 357/50, 54, 23 CS; 156/643; 148/DIG. 50; 427/93

[56] References Cited

U.S. PATENT DOCUMENTS

| | | | |
|---|---|---|---|
| 3,751,722 | 8/1973 | Richman | 357/23 CS |
| 3,970,486 | 7/1976 | Kooi | 357/50 |
| 3,979,765 | 9/1976 | Brand | 357/23 CS |
| 4,001,465 | 1/1977 | Graul et al. | 357/50 |
| 4,013,484 | 3/1977 | Boleky et al. | 357/23 CS |
| 4,023,195 | 5/1977 | Richman | 357/50 |
| 4,044,452 | 8/1977 | Abbos et al. | 357/23 CS |
| 4,104,086 | 8/1978 | Bondur et al. | 29/576 W |
| 4,307,180 | 12/1981 | Pogge | 29/576 W |
| 4,318,118 | 3/1982 | Hall | 357/54 |
| 4,374,011 | 2/1983 | Vora et al. | 29/576 W |
| 4,407,851 | 10/1983 | Kurosawa et al. | |
| 4,462,847 | 7/1984 | Thompson et al. | 29/576 W |
| 4,506,437 | 3/1985 | Godejahn, Jr. | 29/571 |
| 4,541,167 | 9/1985 | Havemann et al. | 29/576 W |

FOREIGN PATENT DOCUMENTS

| | | | |
|---|---|---|---|
| 58-73163 | 5/1983 | Japan . | |
| 19348 | 1/1984 | Japan | 29/576 W |
| 181062 | 10/1984 | Japan | 29/578 |

OTHER PUBLICATIONS

"A New Buried-Oxide Field Isolation for VLSI Devices", K. Kurosawa et al; Jun. 22–24, 1981, 39th Annual Device Research Conference, Santa Barbara, CA.
"A New Bird's-Beak Free Field Isolation Technology for VLSI Devices" Kurosawa et al; Dec. 7–9, 1981, IEDM Technical Digest, International Electron Devices Meeting, Washington, D.C.

Primary Examiner—Brian E. Hearn
Assistant Examiner—John T. Callahan
Attorney, Agent, or Firm—Oblon, Fisher, Spivak, McClelland & Maier

[57] ABSTRACT

A method of manufacturing a MOS device wherein a semiconductor substrate is selectively etched to form a groove in a field region and an element formation region surrounded by the groove such that an angle $\theta$ is formed between a wall of the groove and a first imaginary extension of a top surface of the element formation region, the angle $\theta$ satisfying the relation, $70° \leq \theta \leq 90°$. Then, a field insulating film is deposited in the groove, and a MOS transistor is formed in the element formation region. The element formation region has source, drain and channel regions of a field effect transistor therein and a gate electrode formed on a gate insulating film on the channel region. The gate electrode extends onto the surface portion of the field insulating film. The thickness of an upper portion of the field insulating film above a first imaginary extension of an interface between the gate insulating film and the gate electrode is formed smaller than that of a lower portion of the field insulating film below the first imaginary extension.

6 Claims, 12 Drawing Figures

METHOD OF MANUFACTURING A MOS DEVICE WHEREIN AN INSULATING FILM IS DEPOSITED IN A FIELD REGION

This application is a continuation of application Ser. No. 435,663, filed Oct. 21, 1982.

BACKGROUND OF THE INVENTION

The present invention relates to a method of manufacturing a MOS device having a structure where an insulating film is deposited in a field region.

A semiconductor device such as a memory device using a MOSFET shown in FIG. 1 is known which has a coplanar (or LOCOS) structure to increase packing density and improve reliability. The semiconductor device comprises a p-type silicon substrate 1, a field oxide film 2 selectively formed in the field region, a gate oxide film 3 formed on an element formation region around the field oxide film 2, a gate electrode 4 formed on the gate oxide film 3, and an ion-doped layer 5 which functions as a channel stopper and which is formed in the silicon substrate 1 under the field oxide film 2. The coplanar structure has advantages in that indentation of the element surface is small since part of the field oxide film 2 is formed in the silicon substrate 1, and in that excellent step coverage is obtained in the aluminum wiring which connects semiconductor elements, thereby providing a highly reliable semiconductor LSI. However, lateral extrusions B of this structure which are called bird's beaks are formed in an oxide film, as shown in FIG. 1, adversely affecting microminiaturization of the element.

The narrower the effective channel width Weff of the MOSFET is, the greater the adverse effect. The actual thickness of the gate oxide film 3 becomes greater than a desired thickness thereof, thus increasing variation in the threshold voltage. In the worst case, the thickness of the gate oxide film becomes substantially the same as that of the field oxide film. As a result, the source-drain path is open. As shown in FIG. 2, the threshold voltage VT of the MOSFET is increased when the effective channel width Weff is decreased, thus resulting in the so-called narrow channel effect.

FIG. 3 is a schematic sectional view of a MOSFET having a BOX (Buried-Oxide Isolation) structure which solves the problem of the bird's beak encountered in the coplanar structure. The MOSFET comprises a silicon substrate 1, a silicon oxide film 6 deposited by low-temperature epitaxial growth in a groove with vertical walls, a gate oxide film 3 formed on the element formation region surrounded by the silicon oxide film 6, a gate electrode 4 formed on the gate oxide film 3, and an ion-doped layer 5 which functions as a channel stopper and which is formed in the silicon substrate beneath the silicon oxide film 6. Since the silicon oxide film 6 is formed in this MOSFET without involving high-temperature thermal oxidation, the bird's beaks are not formed. Therefore, the above structure has an advantage in that a MOSFET is formed which has a desired effective channel width. However, we found by experiments that when the gate electrode 4 extends onto the surface portion of the silicon oxide film 6, the threshold voltage VT of the MOSFET decreases with a decrease in the effective channel width Weff, as shown in FIG. 4.

Generally, the electrical characteristics of the MOSFET must not depend on the effective channel width.

SUMMARY OF THE INVENTION

It is an object of the present invention to provide a method of manufacturing a MOS device having an insulator isolation structure wherein dependence of the threshold voltage on the effective channel width is slight, while a substrate surface is kept as smooth as possible.

In order to achieve the above object of the present invention, there is provided a method of manufacturing a MOS device, comprising: selectively etching a semiconductor substrate to form a groove in a field region and an element formation region surrounded by the groove such that an angle $\theta$ is formed between a wall of the groove and a first imaginary extension of a top surface of the element formation region, with the angle $\theta$ satisfying the relation, $70° \leq \theta \leq 90°$. Then, a field insulating film is deposited in the groove. The element formation region has source, drain and channel regions of a field effect transistor therein and a gate electrode formed on a gate insulating film on the channel region. The gate electrode extends onto the surface portion of the field insulating film. The thickness of an upper portion of the field insulating film above a first imaginary extension of an interface between the gate insulating film and the gate electrode is smaller than that of a lower portion of the field insulating film below the first imaginary extension.

According to the above method, the threshold voltage drop which occurs due to the narrow channel effect is prevented. Therefore, the threshold voltage of the MOS device produced according to the present invention does not significantly depend on the effective channel width.

Furthermore, the method of the invention may include forming the insulating film may with a two-layer structure. If the permittivity of the upper insulating film portion is smaller than that of the lower insulating film portion, the extent of projection of the insulating film can be decreased. As a result, excellent step coverage of the wiring layer is provided, thus improving the reliability of the MOS device.

When the insulating film is formed of silicon oxide, an angle $\theta$ formed by the wall of the groove and the imaginary extension of the top surface of the element formation region may be determined to satisfy the relation $77° \leq \theta \leq 90°$ to decrease the height of the projection of the insulating film. When the insulating film is formed of silicon nitride, the angle $\theta$ may be determined to satisfy the relation $70° \leq \theta \leq 90°$.

BRIEF DESCRIPTION OF THE DRAWINGS

Other objects and advantages will be apparent from the following description taken in conjunction with the accompanying drawings, in which.

DETAILED DESCRIPTION OF THE PREFERRED EMBODIMENTS

Figure 1:
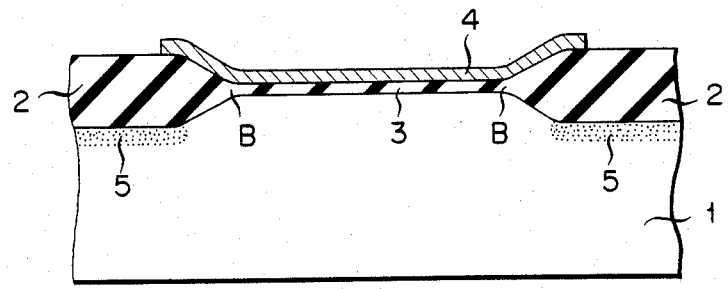
FIG. 1 is a sectional view of a conventional MOS device having a coplanar structure.
Figure 2:
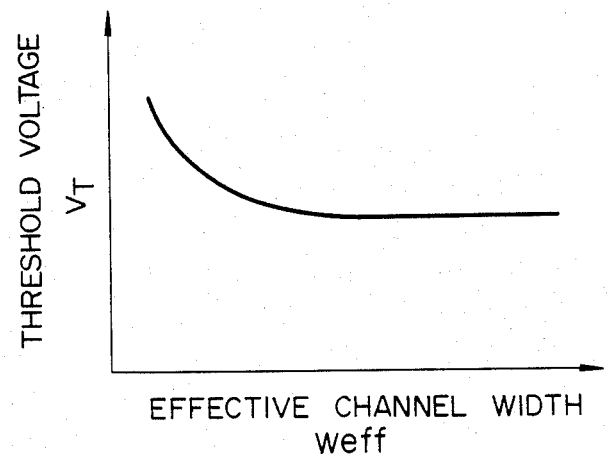
FIG. 2 is a graph showing the threshold voltage of the device shown in FIG. 1 as a function of the effective channel width thereof.
Figure 3:
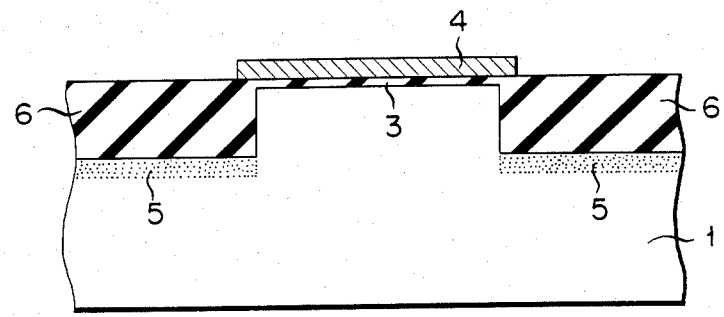
FIG. 3 is a sectional view of a conventional MOS device having a BOX structure.
Figure 4:
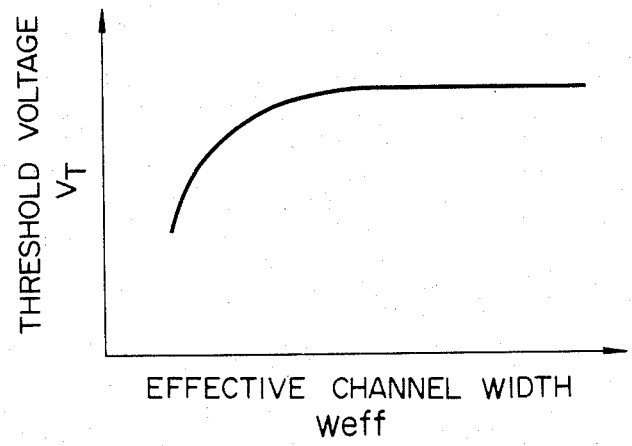
FIG. 4 is a graph showing the threshold voltage of the device shown in FIG. 3 as a function of the effective channel width thereof.
Figure 5:
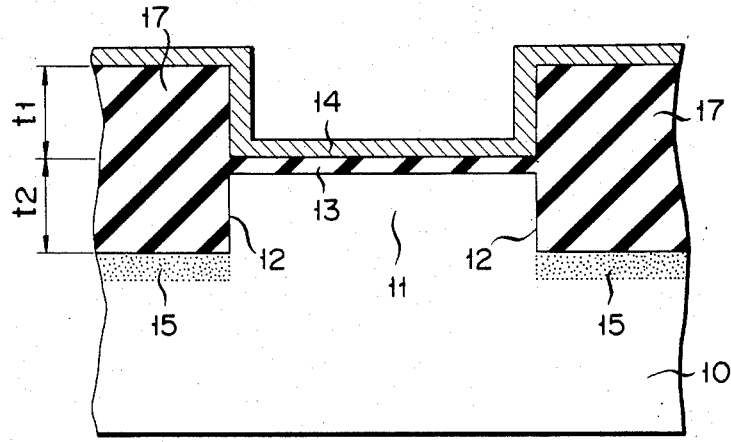
FIG. 5 is a sectional view of a MOS semiconductor device according to a first embodiment of the present invention.

A MOS device according to a first embodiment of the present invention will be described with reference to FIG. 5. A groove 12 which has a substantially vertical wall is formed around an element formation region 11 in which source, drain and channel regions of the MOSFET are formed. An insulating film such as a silicon oxide film 17 is deposited in the groove 12 by low-temperature epitaxial growth. An ion-doped layer 15 as a channel stopper is formed in the surface layer portion of the semiconductor substrate 10 beneath the silicon oxide film 17. A gate oxide film 13 of SiO$_2$ is formed on the surface of the element formation region 11. A polysilicon gate electrode 14 is formed on the gate oxide film 13. The gate electrode 14 extends onto the surface portion of the silicon oxide film 17. The silicon oxide film 17 projects by a thickness t1 above an imaginary extension of the interface between the gate oxide film 13 and the gate electrode 14. The silicon oxide film 17 is embedded to a thickness t2 under the imaginary extension.

Figure 6:
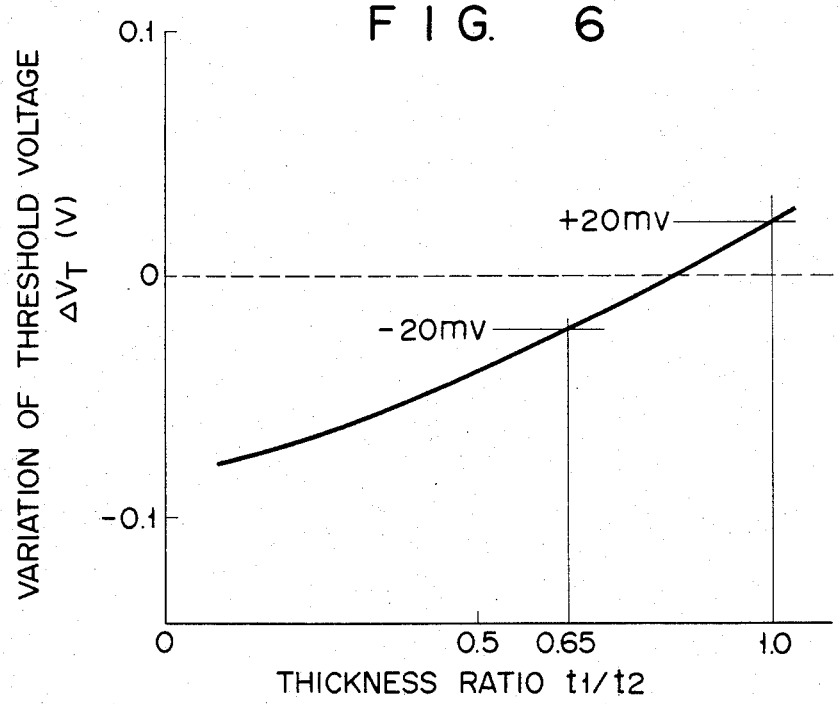
FIG. 6 is a graph showing the variation in the threshold voltage as a function of the thickness ratio t1/t2, that is, as a function of an extent of projection of the insulating film deposited in the groove formed in the field region.

FIG. 6 is a graph for explaining the variation $\Delta VT$ in the threshold voltage as a function of the ratio t1/t2. The overall thickness (t1+t2) of the silicon oxide film 17 is kept constant. Note that the variation $\Delta VT$ in the threshold voltage indicates a difference between the threshold voltage of a transistor which has a sufficiently wide effective channel width Weff and the threshold voltage of a transistor which has an effective channel width Weff of 0.2 $\mu$. The above data is obtained by computer simulation under the following conditions: the impurity concentration Nsub of the silicon substrate 10 is $2 \times 10^{15}$ cm$^{-3}$; the thickness TOX of the gate oxide film 13 is 1,000 Å; the total thickness t1+t2 of the silicon oxide film 17 of the field region is 5,000 Å; and the relative permittivities $\epsilon$s of the gate oxide film 13 and the silicon oxide film 17 are both 3.9. If a tolerance for the variation $\Delta VT$ in the threshold voltage is $\pm 20$ mV in the LSI design, the thickness ratio t1/t2 is preferably in the range of $0.65 \leq t1/t2 < 1$. Within this range, the dependency of the threshold voltage of the MOSFET on the effective channel width Weff is eliminated.

Figure 7A:
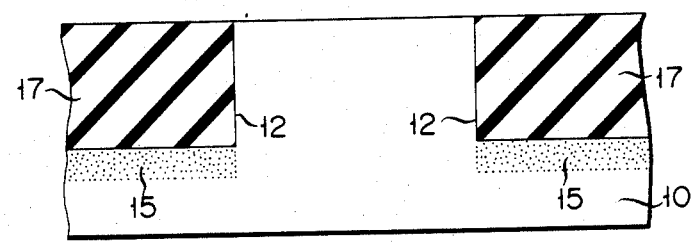
FIGS. 7A to 7D are sectional views for explaining the steps of manufacturing a MOS device according to the present invention.

A method for manufacturing a MOS device according to the present invention will be described with reference to FIGS. 7A to 7D. As shown in FIG. 7A, a silicon substrate 10 is selectively etched to form a groove 12 in the field region. The groove has a substantially vertical wall. An impurity is ion-implanted in the bottom of the groove 12 to form a channel stopper 15. A silicon oxide film 17 is deposited by chemical vapor deposition in the groove 12. The above steps are the same as those in the conventional BOX structure method.

Figure 7B:
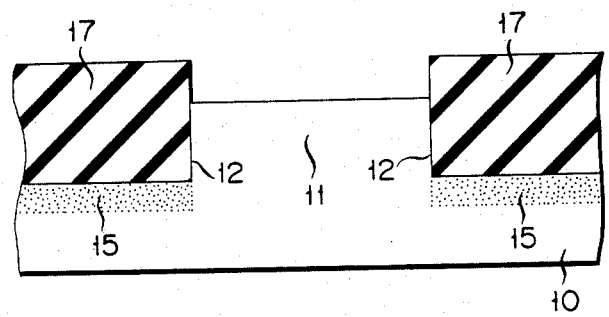
Figure 7C:
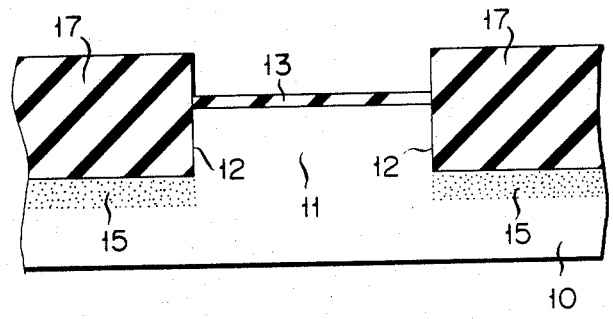
Figure 7D:
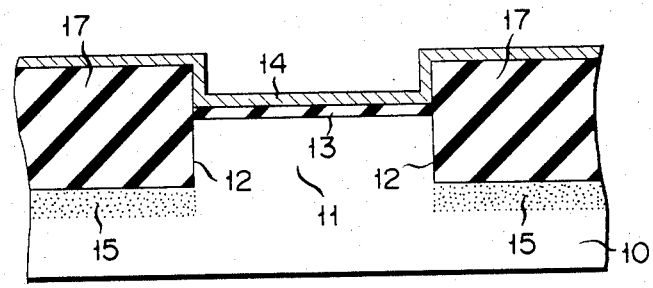

As shown in FIG. 7B, an element formation region 11 surrounded by the silicon oxide film 17 is selectively etched so as to define the thickness of the upward projection of the silicon oxide film 17 which must be smaller than that of the embedded portion thereof. As shown in FIG. 7C, a gate oxide film 13 is formed on the element formation region 11. Furthermore, a polysilicon gate electrode 14 is formed on the gate oxide film 13 and on the silicon oxide film 17.

The structure of FIG. 7B can be provided without etching the silicon substrate 10. This may be achieved by obtaining the structure of FIG. 7A without removing the etching mask (e.g. Al film, Si$_3$N$_4$ film, photoresist film, etc.) used in cutting the groove 12 and then by removing the etching mask thereafter.

Figure 8:
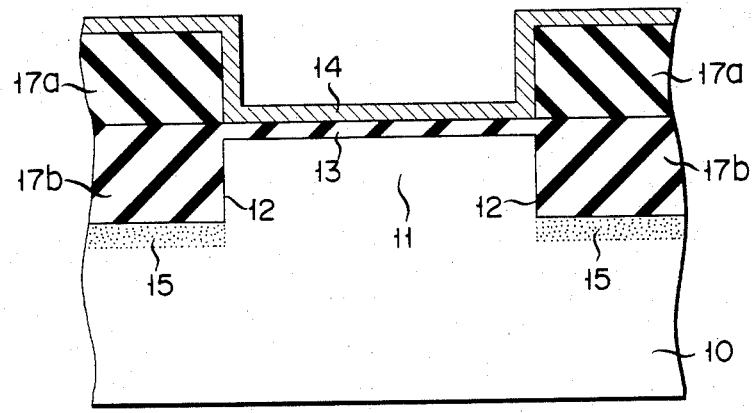
FIG. 8 is a sectional view of a MOS device according to a second embodiment of the present invention.

A MOS device according to a second embodiment of the present invention will be described with reference to FIG. 8. In this embodiment, an insulating film of silicon nitride is deposited in the groove 12. An insulating films 17a and 17b having a two-layer structure are formed in a groove 12 of a silicon substrate 10. The MOS device of this embodiment is the same as that of the first embodiment, except that an upper layer 17a is formed of silicon oxide having a relative permittivity of 3.9, and that a lower layer 17b is formed of silicon nitride having a relative permittivity of about 7. The relative permittivity of the upper layer 17a is smaller than that of the lower layer 17b. As a gate oxide film 13, use is made of a 1,000 Å thick silicon nitride film which is formed by a direct nitrogenization. The same reference numerals used in FIG. 5 denote the same parts in FIG. 8, and a detailed description thereof will be omitted. In the above structure, the thickness ratio t1/t2 for substantially eliminating the variation $\Delta VT$ in the threshold voltage can be smaller than if in the first embodiment the film 17 is formed of silicon nitride alone, because the relative permittivity is smaller than in such first embodiment. As a result, the thickness t1 can be decreased, so that excellent step coverage of the wiring layer can be provided and a highly reliable semiconductor device can be obtained. More specifically, the thickness t1 can be reduced to half. The structure of FIG. 8 may be provided in the following steps.

First, a silicon nitride film is deposited in place of the silicon oxide film 17 shown in FIG. 7A. The surface portion of the silicon nitride film is then etched. On the entire surface of the structure thus obtained there is deposited a silicon oxide film. A photoresist film is coated on the silicon oxide film. The photoresist film has a flat surface. Both the photoresist film and the silicon oxide film are etched at substantially the same rate until the upper surface of the substrate is exposed. The surface portion of the substrate is then etched. The surface of the substrate is nitrided, thus forming a gate insulating film 13. Alternatively, the surface of the substrate may be oxidized, thus forming a gate insulating film 13 of silicon oxide.

Figure 9:
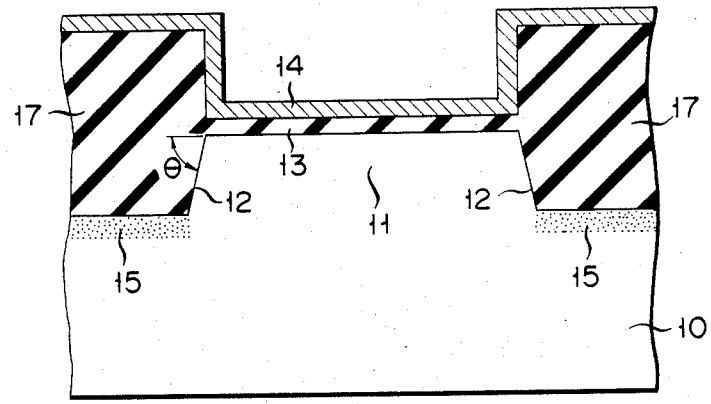
FIG. 9 is a sectional view of a MOS device according to a third embodiment of the present invention.

A MOS device according to a third embodiment of the present invention will be described with reference to FIG. 9. The MOS device of this embodiment is the same as that in FIG. 5, except that the wall of a groove 12 of a silicon substrate 10 is inclined to form an angle $\theta$ smaller than 90° with respect to the imaginary extension of the top surface of an element formation region 11. The same reference numerals used in FIG. 5 denote the same parts in FIG. 9, and a detailed description thereof is omitted. When the angle $\theta$ is set to 80°, the thickness ratio t1/t2 for substantially eliminating the variation $\Delta VT$ in the threshold voltage can be smaller than when the angle $\theta$ is set to 90°. The thickness t1 of the insulating film portion which projects above the imaginary extension of the interface between a gate oxide film 13 and the gate electrode 14 can be decreased as compared with that in the first embodiment. As a result, excellent step coverage can be provided, and the reliability of the semiconductor device is greatly improved. In the third embodiment in which the film 17 is formed of silicon oxide, a maximum effect is obtained when the angle $\theta$ satisfies a relation $77° \leq \theta \leq 90°$. If the insulating film 17 is formed of silicon nitride, a maximum effect is obtained when the angle $\theta$ satisfies a relation $70° \leq \theta \leq 90°$.

What we claim is:

1. A method of manufacturing a MOS device, comprising steps of: selectively etching a semiconductor substrate to form a groove in a field region and an element formation region surrounded by said groove with an angle formed between a wall of said groove and a first imaginary extension of a top surface of said element formation region, the angle satisfying a relation, $$70° \leq \theta \leq 90°;$$

depositing a field insulating film in said groove by chemical vapor deposition; and forming a gate electrode on a gate insulating film on said substrate, said gate electrod extending onto the surface portion of said field insulating film, a thickness of an upper portion of said field insulating film above a first imaginary extension of an interface between said said gate insulating film and said gate electrode having a predetermined value greater than zero and being smaller than that of a lower portion of said field insulating film below the first imaginary extension; and wherein said semiconductor substrate is formed of silicon, said field insulating film is formed of silicon oxide, and a ratio of the thickness of said upper portion of said field insulating film above the first imaginary extension to that of said lower portion of said field insulating film below the first imaginary extension is greater than 0.65 and lower than 1.

2. The method according to claim 1, wherein said field insulating film is formed of silicon oxide, and the angle $\theta$ satisfies the relation:

$$77° \leq \theta \leq 90°.$$

3. The method according to claim 1, wherein said field insulating film is formed of silicon nitride.

4. The method according to claim 1, comprising:
   forming a channel stopper in a surface layer of said semiconductor substrate beneath of said field insulating film.

5. The method according to claim 1, comprising:
   forming said field insulating film with a two-layer structure consisting of two insulating material layers having different relative permittivities, a permittivity of an upper insulating material layer above the first imaginary extension being smaller than that of a lower insulating material layer below the first imaginary extension.

6. The method according to claim 5, comprising:
   forming said upper insulating material layer of silicon oxide; and
   forming said lower insulating material layer of silicon nitride.

* * * * *